(12) United States Patent
Brown et al.

(10) Patent No.: US 9,103,856 B2
(45) Date of Patent: Aug. 11, 2015

(54) HAND-HELD MICROWAVE SPECTRUM ANALYZER WITH OPERATION RANGE FROM 9 KHZ TO OVER 20 GHZ

(75) Inventors: Russell A Brown, San Jose, CA (US); Cindy Robinson, San Jose, CA (US)

(73) Assignee: ANRITSU COMPANY, Morgan Hill, CA (US)

( * ) Notice: Subject to any disclaimer, the term of this patent is extended or adjusted under 35 U.S.C. 154(b) by 783 days.

(21) Appl. No.: 13/448,203

(22) Filed: Apr. 16, 2012

(65) Prior Publication Data

US 2012/0256616 A1   Oct. 11, 2012

Related U.S. Application Data

(63) Continuation of application No. 12/341,758, filed on Dec. 22, 2008, now Pat. No. 8,159,208.

(60) Provisional application No. 61/015,623, filed on Dec. 20, 2007.

(51) Int. Cl.
*G01R 23/16* (2006.01)
*H01P 1/213* (2006.01)
*H03H 7/46* (2006.01)

(52) U.S. Cl.
CPC .............. *G01R 23/16* (2013.01); *H01P 1/2135* (2013.01); *H03H 7/463* (2013.01)

(58) Field of Classification Search
CPC ....... G01R 23/16; H03H 7/463; H01P 1/2135
USPC ...................................... 324/76.23
See application file for complete search history.

(56) References Cited

U.S. PATENT DOCUMENTS

| | | |
|---|---|---|
| 5,179,344 A | 1/1993 | Najle |
| 5,869,959 A | 2/1999 | Tomikawa |
| 6,166,533 A | 12/2000 | Musha |
| 6,861,833 B2 | 3/2005 | Miyauchi |
| 6,888,342 B2 | 5/2005 | Bradley |
| 7,239,218 B2 | 7/2007 | Nakamura |
| 7,352,225 B1 * | 4/2008 | Yu ................................ 327/307 |
| 7,639,100 B2 | 12/2009 | Fuentes |
| 7,701,195 B2 | 4/2010 | Griffault |
| 7,741,831 B2 | 6/2010 | Hirakoso |
| 2002/0097036 A1 * | 7/2002 | Bradley ..................... 324/76.19 |
| 2004/0209584 A1 * | 10/2004 | Bargroff et al. ............ 455/180.1 |

FOREIGN PATENT DOCUMENTS

JP       2007-081799       3/2007

* cited by examiner

*Primary Examiner* — Jeff Natalini
(74) *Attorney, Agent, or Firm* — Tucker Ellis LLP (57) ABSTRACT

A spectrum analyzer that provides from below 9 kHz to above 20 GHz operation range while remaining hand-held. The spectrum analyzer includes an integrated precision stand-alone step attenuator that does not rely on printed circuit board (PCB) mounted circuit elements within the signal path. Further, a PIN diplexing switch separates signals into different base-band and highband paths. The baseband path includes a pre-amplifier for low frequency signals, while the higher frequency bands may not necessarily include a pre-amplifier. The highband path incorporates multi-throw MMIC PIN diode switches to selectively filter different bands of input signals.

3 Claims, 7 Drawing Sheets

HAND-HELD MICROWAVE SPECTRUM ANALYZER WITH OPERATION RANGE FROM 9 KHZ TO OVER 20 GHZ

CLAIM OF PRIORITY

This application is a continuation of U.S. application Ser. No. 12/341,758, filed Dec. 22, 2008 by Brown et al., entitled HAND-HELD MICROWAVE SPECTRUM ANALYZER WITH OPERATION RANGE FROM 9 KHz TO OVER 20 GHz, which claims priority under 35 U.S.C. 119(e) to U.S. Provisional Application No. 61/015,623, entitled "HAND-HELD MICROWAVE SPECTRUM ANALYZER," filed Dec. 20, 2007, each of which applications are incorporated by reference herein in their entirety.

BACKGROUND

1. Technical Field

The present invention relates to a handheld spectrum analyzer, and more particularly over components to enable the spectrum analyzer to operate over a wide bandwidth.

2. Related Art

Currently available hand-held microwave spectrum analyzers have an input frequency range of up to 7.1 GHz. Examples include the Anritsu MS2721B (7.1 GHz), and the Rohde+Schwarz FSH-6 (6 GHz). An external frequency converter can be connected to downconvert a received input signal to the spectrum analyzer and effectively boost the frequency range of the handheld spectrum analyzer. But adding the external frequency converter may create a device that is no longer handheld. Further, to preserve measurement accuracy the cost of the external frequency converter can exceed the value of the spectrum analyzer.

The upper frequency limit of previous handheld spectrum analyzers was constrained largely by the perception that achievement of higher frequency capability would result in unacceptable measurement performance or cost. The selection of inexpensive surface-mount (SMT) switches, amplifiers, mixers, and other elements used to construct current low-cost small size spectrum analyzers has been limited for designs operating at frequencies greater than 6 GHz. A simple extension of prior-art designs using these circuit elements would result in a spectrum analyzer with excessive input noise, signal distortion, and susceptibility to damage from large signals and electrostatic discharge.

The operation range of components tested using a spectrum analyzer, including telecommunication and computing devices, is increasing beyond the 7 GHz limit. Accordingly, it is desirable to find ways to increase the frequency range of a hand-held spectrum analyzer while still providing a low-cost small sized device.

SUMMARY

According to embodiments of the present invention an improved low-cost hand-held microwave spectrum analyzer is provided that includes components enabling it to operate at frequencies well above 7.0 GHz. The purpose of this spectrum analyzer is to measure and display or record the power vs. frequency characteristics of electrical signals. It can also serve to analyze signal quality and to demodulate and decode information-bearing signals.

In one embodiment, the spectrum analyzer is designed to achieve 9 kHz to 20 GHz useful input frequency range with high dynamic range and hand-portability. The spectrum analyzer remains "hand-held," meaning that it can be powered from an internal battery, and a person can comfortably carry it in one or both hands while operating its controls.

Components of the spectrum analyzer initially include an electromechanical step attenuator that does not rely on printed circuit board (PCB) mounted circuit elements within its RF signal path. The step attenuator is a stand-alone precision moving transmission line type device that incorporates relays in an integrated package. The step attenuator achieves lower signal loss, lower SWR, less signal distortion, and greater immunity to electrostatic discharge than can be achieved by a design that relies on PCB-mounted semiconductor switches.

Embodiments of the present invention further include PIN diode diplexing switches that selectively direct signals to either base-band or highband signal paths. The separate baseband path incorporates circuitry to allow operation from the low KHz region up to approximately 5.5 GHz, while the highband path allows operation from 5.5 GHz to 20 GHz or higher.

The baseband path initially provides a pre-amplifier for signals below approximately 4 GHz. Low-cost components are available for the pre-amplifier at this frequency, while at frequencies above 4 GHz in the baseband and highband paths, no pre-amplifier is used since it would require more costly components. To provide broadband termination of the $1^{st}$ mixer IF port, the baseband path incorporates a new quadrature-coupled directional (QCD) filter that incorporates a ring resonator to provide a narrow passband. Further, an inexpensive air dielectric multi-cavity bandpass filter is used to pass a $1^{st}$ mixer IF signal to the $2^{nd}$ mixer input while suppressing signals at the $2^{nd}$ mixer image frequency. The air dielectric $1^{st}$ IF filter operates at higher frequencies than would be practical for ceramic filters commonly used in this type of application.

The highband path is broken into highband and midband paths. In the midband path, multi-throw MMIC PIN diode switches are used to direct the signal through a bank of bandpass filters to selectively filter different bands of signals. The PIN diode MMIC dice are integrated into surface-mount packages that enhance MMIC compatibility with the PCB and improve switch performance. The highband, midband and baseband signals are downconverted using three separate $1^{st}$ mixers, such that the midband and highband paths each operate over an octave of frequency.

A $1^{st}$ LO signal is created that is selectively provided by a multi-way switch to the $1^{st}$ mixer of each of the baseband, midband and highband. The $1^{st}$ LO oscillator frequency is controlled and stabilized by a phase lock loop (PLL) circuit. The PLL incorporates a divide-by-two frequency divider in conjunction with a frequency sampler in the feedback path from VCO to a phase detector. The inclusion of a frequency divider between the VCO and sampler enables the use of a low-cost sampler that has been optimized for lower frequencies to serve with a higher frequency VCO. The output of the $1^{st}$ LO is frequency doubled to provide a signal to the highband $1^{st}$ mixer to extend the frequency range of the highband path significantly, while a selectable filter reduces the spurious subharmonics that result from the frequency doubling.

BRIEF DESCRIPTION OF THE DRAWINGS

Further details of the present invention are explained with the help of the attached drawings in which.

DETAILED DESCRIPTION

Figure 1:
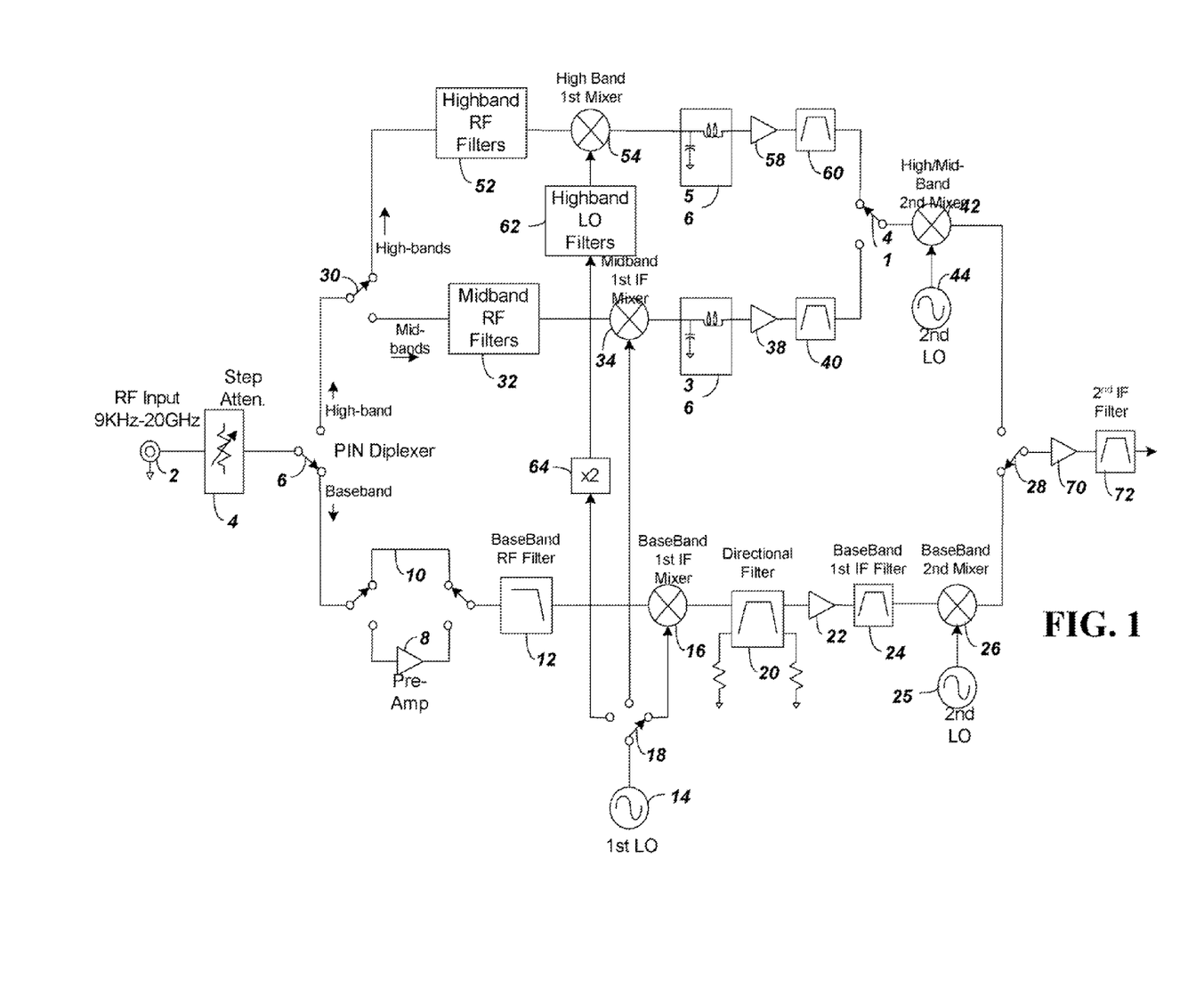
FIG. 1 shows a block diagram of components of a spectrum analyzer according to embodiments of the present invention.

FIG. 1 shows a simplified block diagram of components of a spectrum analyzer according to embodiments of the present invention. The following description along with subsequent figures describes the function of the interconnected blocks of FIG. 1, as well as additional details about components shown in block diagram in FIG. 1.

I. Input Path to Spectrum Analyzer

An electrical signal to be analyzed enters the spectrum analyzer at port 2 through a coaxial connector. For purposes of illustration, the input is shown from 9 kHz-20 GHz, although an alternative input frequency range can be used. The signal passes from input 2 through to a step attenuator 4. The attenuator 4 for the example shown can provide 0 to 65 dB of attenuation, settable in 5 dB increments. The attenuator 4 is used to adjust signal level to within the spectrum analyzer's useful input amplitude range.

A. Precision Stand Alone Step Attenuator

The attenuator 4 is an electromechanical step attenuator that does not rely on printed circuit board (PCB) mounted circuit elements within the signal path. Instead, the step attenuator 4 is of a moving-transmission-line type commonly found in relatively non-portable laboratory test equipment. An example of the step attenuator 4 is the Anritsu 6372B 65 dB step attenuator. This attenuator includes multiple attenuators internally that selectively are connected by electromechanical relays integrated in a precision package. The Anritsu 6372B is a stand alone microwave component with a coaxial cable input and output and a separate low frequency control line connection cable.

Previous step attenuators used in lower frequency handheld spectrum analyzers similarly used relays, but the relays were soldered onto a PCB to select the individual attenuators. The Anritsu 6372B, or similar precision integrated stand alone step attenuator, achieves better performance across the entire 20 GHz range than similar PCB-mounted switches and attenuation elements. In particular, compared to step attenuators that rely on semiconductor switches, it has lower signal loss, lower SWR, produces less signal distortion, and has greater immunity to electrostatic discharge. These advantages serve to improve the present spectrum analyzer's measurement accuracy, dynamic range, and durability.

B. PIN Diplex Highband/BaseBand Switch

Figure 2A:
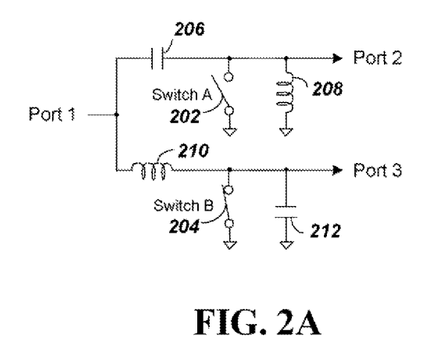
FIG. 2A is a circuit diagram illustrating components of the diplexing switch of FIG. 1 in a highband control state to switch signals from port 1 to port 2, while FIG. 2B graphs the resulting port attenuations.
Figure 2B:
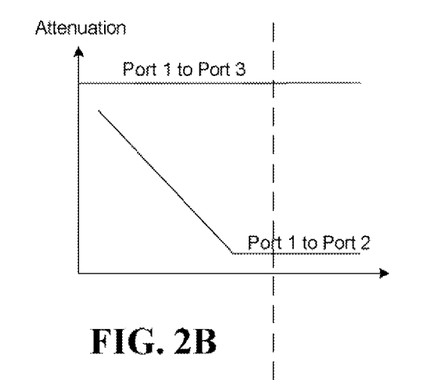
Figure 3A:
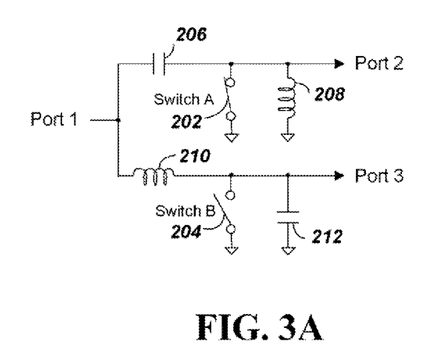
FIG. 3A is a circuit diagram illustrating components of the diplexing switch of FIG. 1 in a baseband control state to switch signals from port 1 to port 3, while FIG. 3B graphs the resulting port attenuations.
Figure 3B:
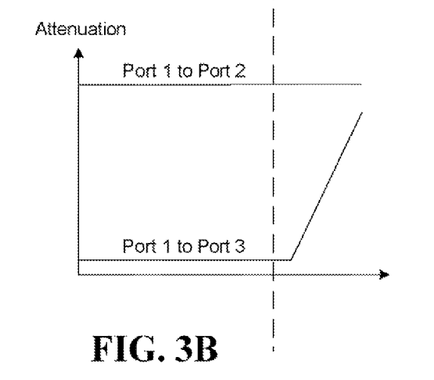

Output from the step attenuator is directed to either a "baseband" path or "highbands" path by a PIN diplexing switch 6. FIGS. 2A and 3A provide circuit diagrams illustrating components of the diplexing switch 6 in different control states. The control state of FIG. 2A switches inputs to a high band path, while the control state of FIG. 3A switches to a baseband path. A graph of the attenuation provided between the ports in the configuration of FIG. 2A is shown in FIG. 2B, while a graph showing attenuation between ports in FIG. 3A is shown in FIG. 3B.

In the switch circuits shown in FIGS. 2A and 3A, a means is provided to split a signal path from Port 1 into separate, selectable paths for high frequency (Port 2) and low frequencies (Port 3). For the high frequency path control state of FIG. 2A, high frequency signals are provided from port 1 to port 2 with low attenuation when switch A (202) remains open. The port 1 to port 2 path exhibits a highpass filter characteristic controlled by capacitor 206 and inductors 210 and 208. Switch B (204) grounds one end of inductor 210 to complete the highpass filter network, and to attenuate high band signals exiting through Port 3. FIG. 2B shows the attenuation from port 1 to 2 is significantly lower than the low pass path of port 1 to port 3 with the switch control state shown in FIG. 2A.

For the low frequency path control state of FIG. 3A, low frequency signals are provided from port 1 to port 3 with low attenuation when switch B (204) remains open. The port 1 to port 3 path exhibits a lowpass filter characteristic controlled by inductor 210 and capacitors 206 and 212. Switch A (202) grounds one end of capacitor 206 to complete the lowpass filter network, and to attenuate low band signals exiting through Port 2. FIG. 3B shows the attenuation from port 1 to 3 is significantly lower than the high pass path from port 1 to port 2 with the switch control state of FIG. 3A.

The switch circuitry of FIGS. 2A and 3A includes reactive elements chosen such that the cutoff frequency of the low frequency path is significantly greater than that of the high-frequency path. The switch control state is changed at a "band-switch" frequency that is between the lowpass and highpass cutoff frequencies. Proper selection of element values yields a switch having low loss from port 1 to port 3 for frequencies from DC to the band-switch frequency, and low loss from port 1 to port 2 for frequencies greater than or equal to the band switch frequency.

The diplexing switch of FIGS. 2A and 3A has performance advantages compared to alternative band selection technologies such as diplexing filters and traditional semiconductor switches. Namely, the alternative band selection diplexing filter provides a gradual transition from low-band to highband as a function of frequency. So, near "crossover" the band selection diplexing filter has high insertion loss (about 3 dB), high reflection (about −3 dB), and only a few dB isolation from port 2 to port 3. By comparison, the diplexing switch used in embodiments of the present invention achieves much lower attenuation in the "on" path (less than 1 dB), much greater attenuation in the "off" path at the crossover (band-switch) frequency, and lower in-band reflection. A traditional wide-band semiconductor SPDT switch has semiconductor elements in series with the signal path, and therefore produces more signal distortion than the diplexing switch, particularly at low frequencies. Because the diplexing switch according to embodiments of the present invention does not have switch elements in series with the signal path, it can be realized with PIN diodes as the switch elements 202 and 204 without compromising low-frequency performance. The diplexing switch, made with PIN diodes is much less prone to damage from transient voltages than are GaAs MMIC switches.

The PIN diplexing switch of FIGS. 2A and 3A provides low loss, low SWR, low signal distortion, and high tolerance to ESD. Common frequency diplexers and other types of 20 GHz-capable electronic switches do not possess all of these benefits. So, use of the PIN diplexing switch benefits the spectrum analyzer's dynamic range and/or durability.

II. BaseBand Path

The baseband path of the lower half of FIG. 1 includes some features carried over from conventional hand-held spectrum analyzers that operated below 7 GHz, but also includes new features that enable a combined operation with higher frequency input bands sharing a common RF input port.

A. Pre-Amplifier

The baseband path further includes switches that selectively connect a pre-amplifier (pre-amp) 8 or a through line 10. The pre-amplifier 8 can be switched into the low frequency signal path to reduce system input noise figure. The pre-amplifier 8 implementation is innovative in the spectrum analyzer circuit of FIG. 1 in that the pre-amplifier 8 serves only the baseband path. In one embodiment, the pre-amplifier 8 is switched in with frequencies below 4 GHz, while other baseband signals above 4 GHz are switched around the pre-amplifier using the through line 10. By restricting function of pre-amp 8 to lower frequency baseband signals only, the pre-amp 8 is realized with inexpensive SMT parts, including the amplifier and supporting GaAs RF switches.

Signals in the baseband path are lowpass-filtered using filter 12 to remove frequency components that would cause unwanted conversion products in the baseband 1st mixer 16, and then mixed with a $1^{st}$ local oscillator (LO) signal from LO 14 in the baseband mixer 16 to produce a $1^{st}$ intermediate frequency (IF) signal that is greater than the cutoff frequency of the baseband input lowpass filter 12. The output of LO 14 is provided in the switch position of switch 18 to the mixer 16 for baseband signals. The switch 18 provides for connection of the LO 14 to the highband $1^{st}$ mixers 34 and 54 described subsequently as well. A unique configuration of circuitry for the LO 14 enables a single LO to be used to drive all of the baseband and highband signals.

B. Sampler Based LO PLL with Frequency Divider

Figure 4:
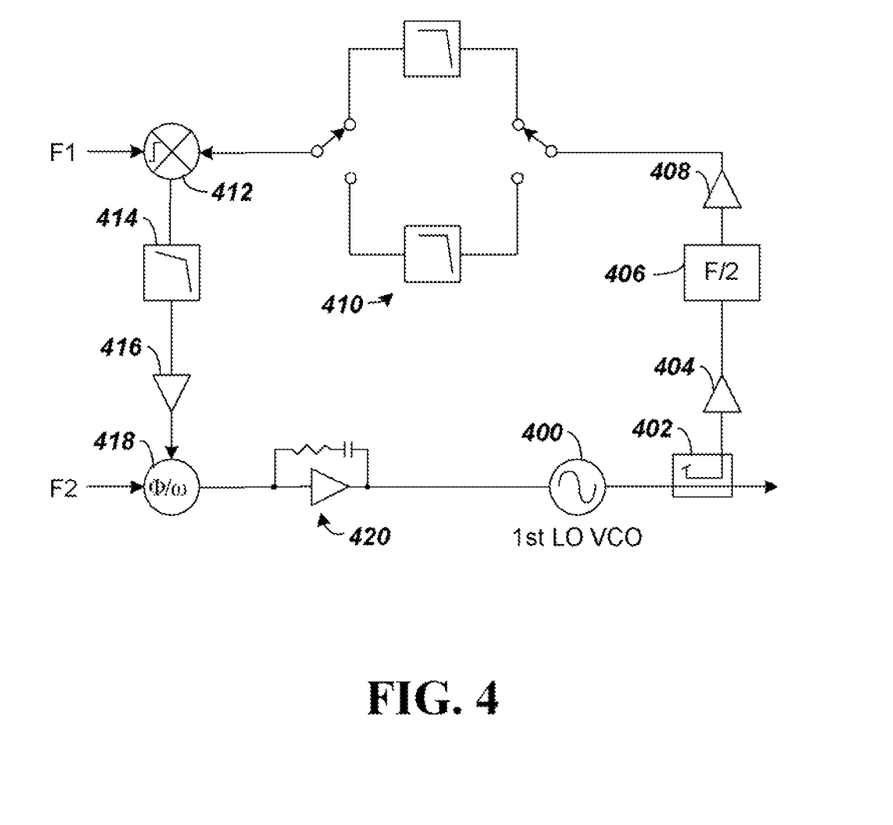
FIG. 4 shows circuitry used to form the 1$^{st}$ LO of FIG. 1, the 1$^{st}$ LO being a sampler based phase locked loop (PLL) circuit with an added frequency divider.

FIG. 4 shows circuitry used to form the $1^{st}$ LO 14, which is a sampler based phase locked loop (PLL) circuit. At least one prior-art 7 GHz hand-held spectrum analyzer and various non-handheld higher-frequency spectrum analyzers have also used a sampler in the $1^{st}$ LO PLL circuit. In these prior-art cases, the sampler is used to convert the $1^{st}$ local oscillator frequency to a DC or low-frequency IF for the purpose of phase locking the oscillator. The circuitry of FIG. 4 also uses a sampler in the $1^{st}$ LO PLL circuit for essentially the same purpose, but with the addition of a simple frequency divider 406 to reduce the sampler input frequency. The sampler therefore can be optimized to operate at a lower input frequency than would be possible without a divider. As a result, a low-cost sampler is realized from inexpensive surface-mount parts.

In summary, the PLL circuit of FIG. 4 includes a voltage controlled oscillator 400 providing the output of the $1^{st}$ LO. A small portion of the signal from the VCO 400 is split from the VCO output path by coupler 402, amplified through 404, and then applied to a divide-by-two frequency divider 406. The output of the frequency divider 406 is amplified through 408, then selectively provided through one of two filters 410, depending on the frequency of the LO signal used, to the "RF" input port of sampler 412. The sampler 412 is effectively a harmonic mixer with a low-frequency "LO" input provided at a frequency F1. The sampler mixes "RF" from 410 with harmonics of F1 to produce an "IF" output. The sampler IF output is filtered by lowpass filter 414 to reject unwanted mixing products, amplified at 416 and applied to the "feedback" input of phase/frequency detector 418. Frequency F2 is applied to the "reference" input of phase/frequency detector (PFD) 418. The PFD 418 produces a DC output that is amplified by loop amplifier 420 then applied to the tuning port of $1^{st}$ LO VCO 400. The closed loop made up of the described circuit elements causes the sampler IF signal to equal the reference signal F2 in frequency and phase. In one example, the $1^{st}$ LO VCO frequency is within a range of 6 to 12 GHz, signal F1 is provided by a low-noise frequency synthesizer having a small fractional tuning range centered at approximately 200 MHz, and F2 is provided by a frequency synthesizer having a small fractional tuning range centered at approximately 25 MHz.

The circuitry of FIG. 4 is particularly innovative in its use of the monolithic microwave integrated circuit (MMIC) frequency divider 406 in the input path to the sampler 412. The frequency divider 406 allows the use of a pre-existing, proven RF synthesizer and sampler 412 to phase-lock the VCO 400 at frequencies that are N=2 times the design frequency of the sampler 412. Although the frequency division number for divider 406 is set at two, other values of N could also be practical. In the circuit of FIG. 4, the frequency divider 406 divides the frequency of VCO 400 by N before sampling occurs. The sampler 412 can be optimized to down-convert frequency F/N with minimal conversion loss. The prescaler (frequency divider 406) and sampler 412 combination confers much of the performance benefit of a sampling downconverter while permitting the use of a sampler 412 that is simpler to design or that costs less than would a sampler that is optimized to operate at a higher, un-divided frequency. As compared to a traditional divider-less design in which the sampler must operate at the VCO frequency, the divider/sampler combination of FIG. 4 allows the sampler 412 to be optimized for a lower input frequency. The lower-frequency design is more tolerant of parasitic circuit elements in the parts that make up the sampler 412, and therefore better suited to inexpensive surface-mount construction. Although the traditional divider-less approach offers a theoretical performance advantage when used in a PLL, that advantage may not be fully realized as compared to a divider/sampler combination due to the difficulty in achieving ideal sampler behavior at higher frequencies.

The PLL of FIG. 4 operates essentially as follows: a portion of the output of VCO 400 is applied to a GaAs MMIC prescaler frequency divider 406 which divides the output frequency of VCO 400 by 2. Output from the prescaler 406 is down-converted by the sampler 412 to produce a low-frequency sampler IF output. LO drive for the sampler 412 (F1) is provided from a programmable RF synthesizer, not shown. The IF from sampler 412 is compared in the PFD 418 against a reference signal F2. The PFD 418 produces a DC output that minimizes when the PFD 418 inputs are synchronous and aligned in phase. The DC output from the PFD 418 is amplified and used to tune the VCO 400. The closed-loop circuit of FIG. 4 continuously adjusts the frequency of VCO 400 such that the two inputs to PFD 418 align in frequency and phase. As a result, the frequency of VCO 400 ($F_{VCO}$) stabilizes at a frequency that is $F_{VCO}=2*(N*(F1)+(P)*F2)$, where N=an integer defining the frequency division, F1=frequency of the RF synthesizer, P=polarity of the PFD, and F2=PFD reference frequency.

C. Quadrature-Coupled Directional (QCD) Filter

Referring again to FIG. 1, the 1st IF signal from mixer 16 passes through a directional bandpass filter 20. This filter 20 passes the IF signal with minimal loss, but absorbs signals that are outside of its narrow passband. The directional filter 20 improves $1^{st}$ mixer inter-modulation performance by absorbing the unused 1:1 mixing product. Some embodiments of the present invention introduce a new topology for the directional filter 20 that provide improved performance and manufacturing advantages that are described to follow.

Figure 5:
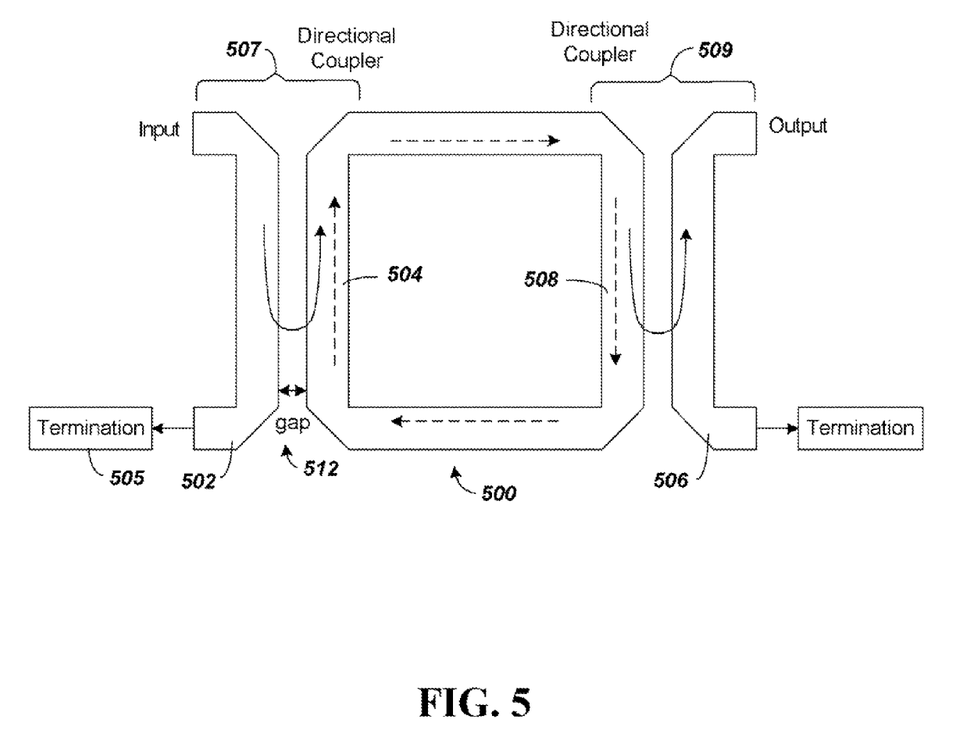
FIG. 5 shows a conventional traveling wave directional filter.

Prior to describing the new topology of directional filter 20, reference is made to FIG. 5 that shows an alternative directional filter that can be used for filter 20 of FIG. 1 that offers some performance advantages. The circuit of FIG. 5 is a traveling wave directional filter that uses a ring resonator. The circuit was described generally in: "Traveling Wave Directional Filter" by F. S. Coale (October 1956 IRE Transactions on Microwave Theory and Techniques). The two port non-reflective bandpass filter of FIG. 5 is commonly implemented as a stripline or microstrip circuit, with conductors printed on a planar dielectric substrate.

The resonator of the circuit of FIG. 5 is a transmission line loop 500 with an effective electrical path length around the loop of one wavelength at its fundamental resonant frequency. An input directional coupler 507 formed by transmission line 502 as a primary and leg 504 of loop 500 as a secondary introduces a signal into the loop 500, launching the signal predominantly in one direction. At resonance, a circulating "traveling wave" builds within the loop 500, synchronously reinforced by the coupled input signal. An output directional coupler 509 formed by transmission line 506 as a primary with leg 508 as a secondary is located on the side of the loop opposite the input coupler 507, and couples a signal out of the loop 500. The circuit of FIG. 5 passes a signal from input to output with low loss at signal frequencies for which electrical length of the loop is one wavelength. The coupling factor of the input and output of couplers 507 and 509 largely determines spectral width of the passband. At frequencies sufficiently "off resonance," the input signal does not couple effectively to the loop resonator 500, and instead is absorbed by the input coupler termination 505. Out-of-band signals are therefore largely absorbed, and so their reflection is suppressed. The circuit is reciprocal: its input and output connections can be exchanged without affecting its behavior.

The circuit of FIG. 5 has some disadvantages. First, the microstrip implementations are not generally suitable for fractional bandwidth greater than a few percent. Further, the higher fractional bandwidth requires the couplers 507 and 509 to be made with a very small gap 512 between primary and coupled arms, which make circuit behavior very sensitive to fabrication tolerance. Because larger fractional bandwidths are not practical, the type of filter shown in FIG. 5 is commonly made with a fractional bandwidth of a few percent or less. But for such narrow filters, center frequency tolerance can be significant vs. bandwidth. As a result, a further drawback is that center frequency tuning may be required to avoid excessive insertion loss. Another drawback is that the microstrip implementation of the filter of FIG. 5 is prone to having an undesirable secondary transmission peak due to the excitation of resonant modes that are close in frequency to the fundamental resonance of the traveling wave. Suppression of the spurious modes is highly dependent upon circuit fabrication tolerance.

Figure 6:
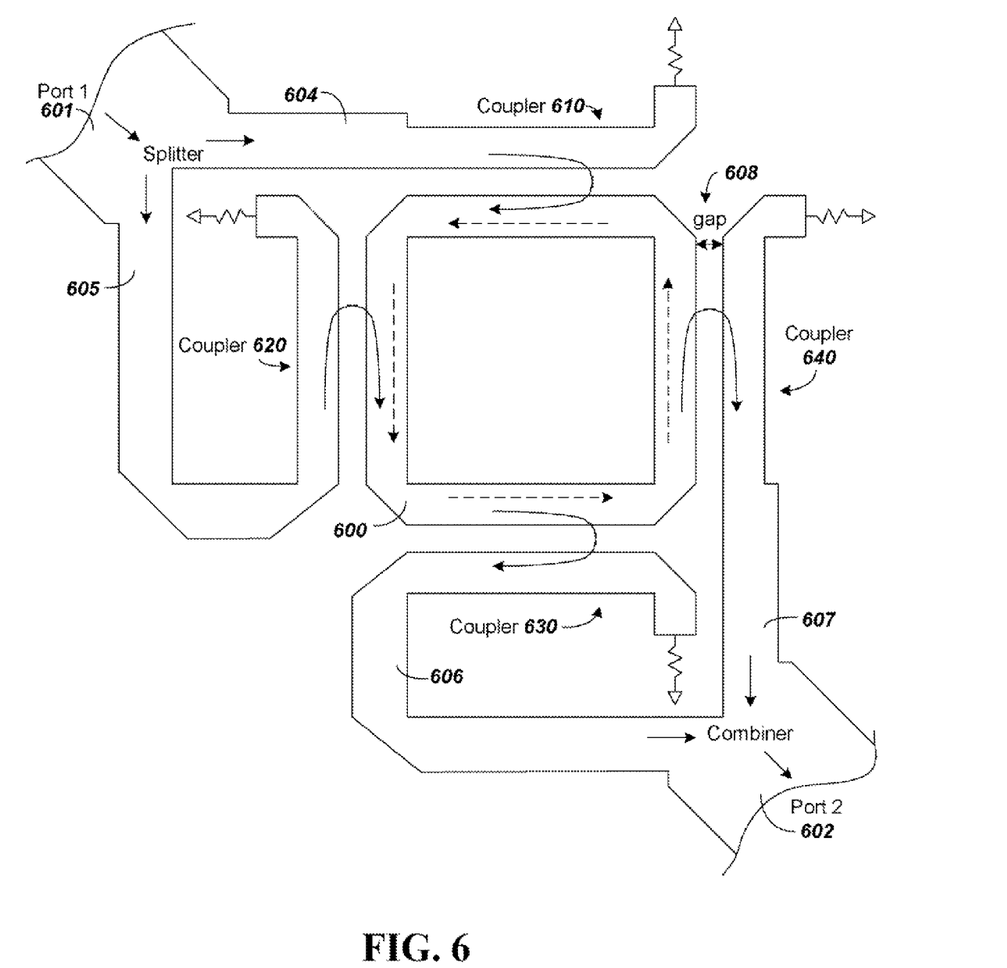
FIG. 6 shows a quadrature-coupled directional (QCD) filter according to embodiments of the present invention as used in the circuit of FIG. 1 that replaces the conventional traveling wave directional filter of FIG. 5.

FIG. 6 shows the basic layout of components of the QCD filter according to embodiments of the present invention, the QCD filter being usable as filter 20 of FIG. 1. The QCD Filter is a two-port electrical bandpass filter that absorbs the signals it does not pass. It is considered an improvement to the directional filter circuit of FIG. 5 in that the QCD Filter of FIG. 6 achieves greater fractional bandwidth, lower sensitivity to fabrication tolerance, improved suppression of a spurious resonance mode, and reduced reflections. Although the QCD filter is contemplated for use in other applications than a spectrum analyzer, it is described herein with application within the frequency converter section of a spectrum analyzer of FIG. 1, where the "QCD Filter" passes a desired mixing product while absorbing other mixing products.

The QCD filter can be implemented in either stripline or microstrip. The impedance of both input Port 1 (601) and output Port 2 (602) is assumed to be $Z_0$ to match a connecting impedance of $Z_0$ for purposes of this description. In practice, circuit element dimensions and values can be adjusted to optimize port match, and the circuit can be made to present unequal impedances at Port 1 (601) and Port 2 (602). Signal frequency is the design passband center frequency for purposes of this description, unless stated otherwise.

Like the circuit of FIG. 5, the QCD filter of FIG. 6 includes a ring resonator 602 that is a closed loop of transmission line having an electrical circumference of one wavelength at the design passband center frequency. Four directional couplers, 610, 620, 630 and 640, are formed using the ring 600 and respective coupling transmission lines 604, 605, 606, 607 such that the ring metal acts as one entire branch of each coupler. The couplers are spaced equally about the circumference of the ring such that the path length along the ring between the centers of adjacent couplers is ¼ wavelength. Ideally, each coupler is ¼ wavelength long, although in typical applications, the coupled sections are made less than ¼ wavelength to allow space for terminations and transmission line bends. Given the simplifying case of port impedance being $Z_0$ at both Port 1 and Port 2, all four couplers 610, 620, 630 and 640 have an identical length and coupling gap (illustrated by gap 608), and are designed to have coupler port impedances of $2Z_0$. Impedance of the ring transmission line segments that connect between couplers is also, ideally, $2Z_0$.

Signal power incident to Port 1 is split onto the two transmission line paths 604 and 605, each transitioning to a characteristic impedance $2Z_0$. These transmission lines deliver half of the input power to coupler 610 and half to coupler 620. Couplers 610 and 620 are adjacent on the ring 600, and are configured such that both couplers launch signal into the ring 600 in the same direction. Signals injected into the ring by coupler 610 will travel ¼ wavelength in the ring before reaching the electrical center of coupler 620. Transmission line length of line 605 from the input splitter is made ¼ wavelength longer than the length of line 604 from the splitter so that the traveling wave introduced into the ring by coupler 620 will be aligned in phase with the traveling wave introduced by coupler 610. The traveling waves introduced into the ring by the two couplers 610 and 620 therefore add constructively. Because of their ¼ wavelength spacing about the ring, and the 90 degree relative phase of their inputs, the two couplers 610 and 620 can be said to act "in quadrature" to reinforce the circulating traveling wave. The lines 604 and 605 are each terminated with real impedance $2Z_0$ to absorb input power that does not couple into the ring.

A portion of the power circulating within the ring is coupled out by couplers 630 and 640, and exits these couplers through lines 606 and 607 respectively. Signals exiting coupler 640 are delayed by ¼ wavelength relative to the signals exiting coupler 630 due to the circulating wave's direction of travel in ring resonator 600 and the relative position of coupler 630 and 640 around the ring. The transmission lines 606 and 607 have a characteristic impedance of $2Z_0$ and join to form a single output 602 at impedance $Z_0$ at Port 2. Transmission line 606 is made ¼ wavelength longer than the transmission line 607 so the coupled outputs will sum in-phase at the combiner port 602. Combined output impedance presented at Port 2 is $Z_0$. Coupler port lines 606 and 607 are each terminated with real impedance $2Z_0$ to absorb power incident to Port 2 that does not couple into the ring.

The QCD filter circuit of FIG. 6 offers several advantages over previous filter circuits, including the ring resonator circuit of FIG. 5. First, the "QCD Filter" couples signal into and out of the ring resonator using couplers that have twice the port impedance "$2Z_0$" of the single couplers of FIG. 5. For stripline and microstrip implementations, the higher impedance translates to greater coupling gap 608 for a given filter bandwidth, as opposed to the gap 512 of FIG. 5. For a given bandwidth, the larger coupling gap reduces filter sensitivity to coupling gap tolerance. So, where minimum coupling gap tolerance is constrained by limits of lithography or other manufacturing processes, the QCD filter of FIG. 6 can yield filters with greater passband bandwidth and lower sensitivity to gap tolerance compared to filter circuitry such as shown in FIG. 5. Second, the QCD filter of FIG. 6 can yield practical microstrip and stripline filters with passband bandwidth great enough to eliminate the need for precise center frequency tuning. Third, the QCD filter of FIG. 6 reduces the magnitude of and sensitivity to spurious resonance modes that are excited by the presence of traveling waves circulating about the ring 600 in opposite directions as compared to FIG. 5. As such, it reduces the degree to which spurious resonance modes can affect passband shape (transmission vs. frequency characteristic). Finally, the QCD filter achieves lower signal reflection than does the prior art, particularly in the transition regions bordering the 3 dB passband.

D. Air-Dielectric Multi-Cavity Filter

Referring again back to FIG. 1, the output of the directional filter 20, which can be the QCD filter of FIG. 6, is amplified using amplifier 22 and then passed through a $1^{st}$ IF bandpass filter 24 that is used mainly to suppress $1^{st}$ IF signal power at the 1:1 image frequency of the baseband $2^{nd}$ mixer 26. The baseband $2^{nd}$ mixer 26 combines the first IF signal output from the baseband $1^{st}$ mixer 16 with a LO signal from the $2^{nd}$ LO 25 to convert the $1^{st}$ IF signal to a comparatively low $2^{nd}$ IF frequency. Baseband $2^{nd}$ mixer IF output is provided to switch 28 that will select either the $2^{nd}$ IF signal from the baseband $2^{nd}$ mixer 26 or from the highbands $2^{nd}$ mixer 42 for application to the $2^{nd}$ IF bandpass filter 72.

Figure 7:
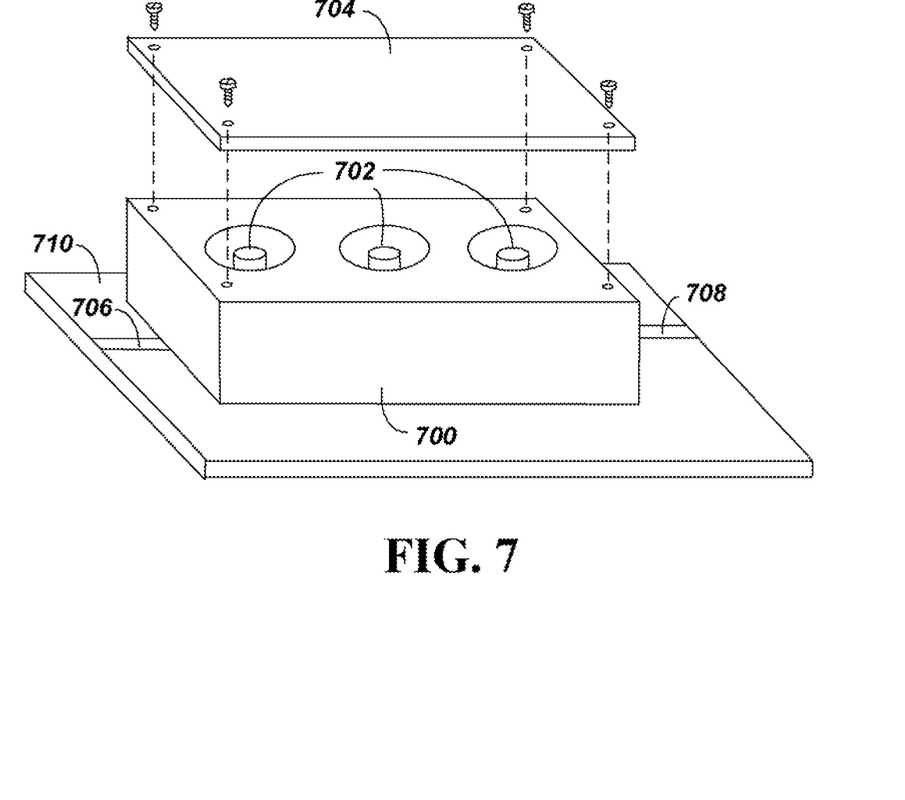
FIG. 7 illustrates an air-dielectric multi-cavity filter used in the circuit of FIG. 1.

The baseband filter 24 can be an air-dielectric multi-cavity filter shown in perspective view of FIG. 7 making it unique in hand-held spectrum analyzers. Compared to other types of bandpass filters commonly used for this purpose, the air-cavity filter has lower passband loss for a given amount of image rejection. High-Q and frequency precision of the air-cavity filter give sufficient selectivity to enable the use of a low-cost, low frequency $2^{nd}$ IF, but with loss low enough to achieve an acceptable system input noise figure. The low loss of the air-cavity $1^{st}$ IF filter, thus, improves the spectrum analyzer's overall noise figure. Previously, the use of such air-dielectric filters was limited to expensive, relatively non-portable laboratory equipment.

The air-dielectric multi-cavity filter of FIG. 7 includes a metal filter body 700 that is preferably a good conductor, or plated with a good conductor such as silver. The cavities are in the form of a cylindrical hollow with coaxial center posts 702 formed by machining out areas in the body 700. The machined areas, thus, are air-dielectric filled. At resonance each post 702 acts like an inductor and the gap from the top of the post to the lid 704 acts like a capacitor. Taken together, the inductance and capacitance act like an LC tank circuit and set the resonant frequency. The machined cavities, if suitably excited, will resonate at a particular frequency that is determined by the physical dimensions of the cavity, cavity center post, and air gap from post to cavity cover 704.

To excite the filter formed in the body 700, a PCB trace 706 transmits a signal through a coupling element (not shown) into a first cavity of the body 700. This coupling element is essentially a small antenna within the cavity. In the multi-cavity filter, the separate coupling elements transmit a signal from cavity to cavity. An aperture in the wall between cavities (not shown) can be used as the cavity-to-cavity coupling element. An output coupling element transfers signal power from the final cavity to a load, such as a PCB trace 708. The filter body 700 may be mounted on a PCB substrate 710 as shown. The coupled cavities form a bandpass filter that passes a single frequency with low attenuation, and attenuates signals at other frequencies. The cavity resonators are effectively ganged together by being formed in the same metal body 700. Prior art filters commonly used in handheld spectrum analyzers were formed by ganging together quarter-wave coaxial resonators having a ceramic dielectric. But such a ceramic filter can have insufficient selectivity or too great a signal loss for application within the present spectrum analyzer. The present spectrum analyzer has an unusually high ratio of $1^{st}$ IF to $2^{nd}$ IF frequency, which requires a low fractional bandwidth of the $1^{st}$ IF filter 24 shown in FIG. 7, and which requires a $1^{st}$ IF filter 24 to be fabricated with low-loss, high-selectivity resonators, such as air cavities. The filter of FIG. 7 is not to scale, in that the filter will be very small as realized for the 6.5 GHz $1^{st}$ IF application.

III. HighBand and Midband Paths

Referring back to FIG. 1, the PIN diplex switch 6 has a second output separate from the baseband path described above to connect to the highband path. The highband path from PIN diplex switch 6 then is directed by switch 30 into either highband or midband paths.

A. PIN Diode Band Switched Filters

Figure 8:
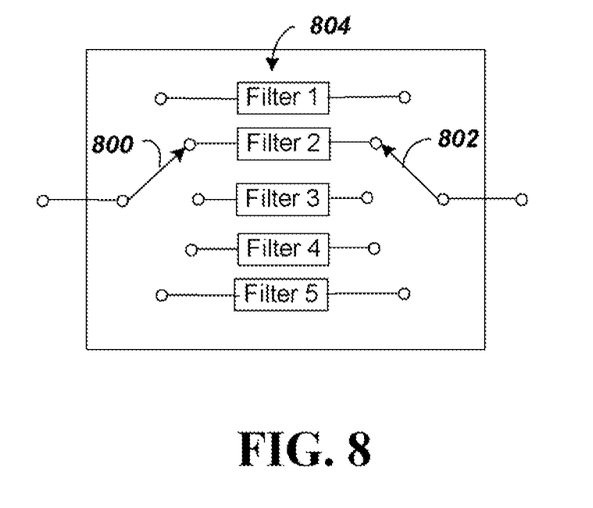
FIG. 8 is a block diagram showing switches and filters making up a midband input filter for the circuit of FIG. 1.

The "midbands" signal path is directed through midband RF bandpass filters 32. A block diagram of the switches and filters making up bandpass filter 32 is shown in FIG. 8. The filters 32 include single-pole-three-throw (SP3T) PIN diode-type switches illustrated as switches 800 of FIG. 8 that selectively directs the midband signal through one of five filters 804, each of the filters 804 covering a different portion of the midband. A similar switching circuit 802 selects one of the five filter outputs for application to the midbands $1^{st}$ mixer. The use of multi-throw MMIC PIN switches for band switching is unique among hand-held spectrum analyzers. Prior-art hand-held spectrum analyzers did not use PIN MMICs for band switching because inexpensive SMT GaAs MMIC multi-throw switches are available for use at frequencies below 8 GHz. But multi-throw GaAs switches for use above 8 GHz were not commercially available at the time of this design.

Figure 9:
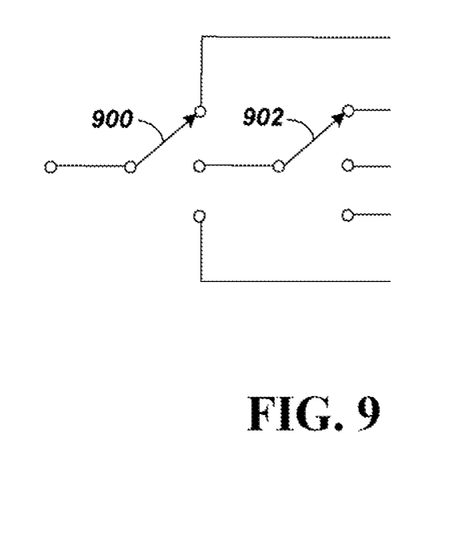
FIG. 9 shows how SP3T switches can be connected to form the switches for FIG. 8.

To provide the multi throw switches 800 and 802 a cascade of the two SP3T PIN switches were used as illustrated in FIG. 9. The two SP3T switches 900 and 902 realize the SP5T switch 800 function with fewer series switching elements and fewer switch packages than would be possible using the more obvious alternative of packaged SPDT GaAs MMIC devices. The two SP3T cascade has lower insertion loss and material cost, thus reducing spectrum analyzer noise figure and cost.

In addition to the SP3T switch configuration, an innovative surface mount technology (SMT) package is preferably used to better facilitate use of MMIC PIN switch dies that make up the SP3T switches, such as the illustrated switches 900 and 902 in FIG. 9. Each individual SP3T switch die is inside a special SMT package that is attached to the present spectrum analyzer PCB. The filters interconnected by the SP3T switches are separately printed on the PCB to which the SMT switch packages are soldered. For example, the switch arrangement shown in FIG. 9 would be done using two SMT packages, each containing a SP3T PIN switch MMIC. The switch 902 would most likely be fed by position 1 or 3 of switch 900. Although described with individual SP3T switch packages for simplicity, higher levels of integration in the MMIC packaging are possible. The switch dies are mounted to a metal or ceramic substrate within the SMT package. The package provides a comparatively large ground pad for the dies, a microstrip interface from the wire bond pads to the substrate edges, and a protective cover.

The package provides a reliable, high-performance RF interface from MMIC to a PCB. The surface mount package facilitates mounting of the PIN switch dies to the spectrum analyzer PCB. The package provides a much larger ground patch and more widely spaced connections to the PCB traces than would be practical with chip-on-board assembly techniques. The package provides controlled-impedance lead-outs from the wire bond pads to the PCB connections at the package edges. The package protects the die and wire bonds, and facilitates assembly to a PCB using standard surface mount processes. The package improves switch isolation by reducing ground inductance and by increasing separation of PCB traces. The use of a multi-throw PIN switch, packaged in this manner, is unique among hand-held spectrum analyzers, and provides cost benefits compared to SMT GaAs SPDT switches in multi-throw switch applications.

B. MidBand $1^{st}$ IF Filters and Common $2^{nd}$ Mixer

Referring again back to FIG. 1, the filtered "midbands" signal from filters 32 combines with $1^{st}$ LO signal from LO 14 in the midband $1^{st}$ mixer 34 to produce a $1^{st}$ IF frequency that is lower than the midbands RF input frequencies provided from the output of midband filters 32. The IF signal from mixer 34 is filtered by a simple LC lowpass filter 36 that has a diplexed input termination to absorb high frequency mixing products The signal is then amplified by amplifier 38 and then filtered again in a ceramic coaxial resonator bandpass filter which rejects primarily signal power at the $2^{nd}$ mixer 42 1:1 image frequency. With the midband having a higher ratio input frequency to the $1^{st}$ mixer 34 vs. $1^{st}$ IF frequency output from mixer 34, the more complex QCD filter 20 of the baseband path is not required. Further, the bandpass filter 40 can be a less complex ceramic filter than the air-dielectric multi-cavity filter 24 of the baseband. The switch 41 allows the midband and highband paths to both use the common $2^{nd}$ mixer 42 and $2^{nd}$ LO 44. Switch 28 selects the $2^{nd}$ IF output from either the highbands $2^{nd}$ mixer 42 or the baseband $2^{nd}$ mixer 26 for application to the $2^{nd}$ IF amplifier 70. Output of the $2^{nd}$ IF amplifier is bandpass filtered by $2^{nd}$ IF filter 72. The $1^{st}$ and $2^{nd}$ LO frequencies can be chosen such that a single $2^{nd}$ IF filter 72 can be used in conjunction with both the highbands $2^{nd}$ mixer 42 and lowbands $2^{nd}$ mixer 26. Signal output from $2^{nd}$ IF filter 72 can be converted to a lower frequency then digitized and analyzed, or can be digitized directly without further downconversion, then analyzed.

C. Highband Filters

Referring back to the switch 30, the highband signals are provided from the switch 30 to highband RF filters 52. In the case of highband filter 52, only two filters are desired as opposed to the five filters of FIG. 32 shown in FIG. 8, so the switches can be single pole double throw MMIC switches. Signal output from the selected highband filter 52 is applied to the highband $1^{st}$ mixer 54. Each of the filters in highband filters 52 suppresses primarily the 1:1 image frequencies of the $1^{st}$ mixer 54.

The "highbands" $1^{st}$ mixer combines the filtered "highbands" RF signal with a frequency-doubled signal from the $1^{st}$ LO 14 to produce a comparatively low $1^{st}$ IF frequency. The 1st IF signal from mixer 54 is filtered using a simple LC filter 56, that has a diplexed input termination to absorb high frequency mixing products, amplified by amplifier 58, and then filtered by a ceramic coaxial resonator bandpass filter 58. As with the midband path, in the highband path the QCD filter 20 and the air-dielectric multi-cavity filter 24 of the bandpass path are not required. An electronic switch 41 then directs the filtered $1^{st}$ IF signal into the $2^{nd}$ mixer 42, where it is combined with $2^{nd}$ LO 44 for conversion to a comparatively low $2^{nd}$ IF frequency. The $2^{nd}$ IF frequency will have a range matching that of the baseband path output to apply through switch 28 to the $2^{nd}$ IF amplifier 70. Output from $2^{nd}$ IF amplifier is bandpass filtered by $2^{nd}$ IF filter 72. The signal output from $2^{nd}$ IF filter 72 can then be converted to a lower frequency then digitized and analyzed, or can be digitized directly without further downconversion, then analyzed.

D. LO Frequency Doubler and Filters for HighBand Mixer

Embodiments of the present invention are unique in that they incorporate switch-selected multiple bandpass filters 62 in the doubled LO path applied to the high band mixer 54. The frequency of the $1^{st}$ LO 14 is doubled by frequency multiplier 64, with the doubled LO output provided to highband LO filters 62. Previous handheld spectrum analyzers that have a doubled $1^{st}$ LO used only a single bandpass filter in the doubler output path. For a given attenuation of VCO fundamental and $3^{rd}$ harmonic, the multiple switched filters 62 can collectively pass a greater range of the doubled VCO frequency than would a single bandpass filter. The switched filters 62 can have a configuration similar to FIG. 8, and can use MMIC SPDT switches. The multiple filters 62 collectively pass a wider range of doubler output frequency than would be possible with a single bandpass filter that provides similar suppression of the fundamental and $3^{rd}$ harmonic of the doubler input frequency. The bandpass filters 62 suppress primarily the fundamental and $3^{rd}$ harmonic of the VCO frequency so as to reduce associated spurious mixing products in the "highbands" $1^{st}$ mixer. Suppression of output frequencies of the doubler 64 other than 2*(doubler input frequency) is necessary to minimize spurious frequency products in the mixer 54 that uses this frequency-doubled signal as it's LO. By incorporating multiple switch-selected filters 62 in its $1^{st}$ LO frequency output that is doubled by doubler 64, the system is able to achieve greater useful frequency range from its highbands" $1^{st}$ mixer 54 than would otherwise be practical while still suppressing spurious outputs of the doubler 64. RF input frequency range for the highband path mixer 54 is correspondingly increased by the greater LO range, without compromise to the spectrum analyzer's RF-related spurious specification.

E. Highband, Midband and Baseband $1^{st}$ Mixers

Embodiments of the present invention are further unique among hand-held microwave spectrum analyzers in that they use three $1^{st}$ mixers 16, 34 and 54. The midbands and highbands $1^{st}$ mixers 34 and 54 each operate across an input frequency range of approximately one octave, resulting in low conversion loss. Splitting the spectrum analyzer input frequency range among the three $1^{st}$ mixers 16, 34 and 54 allows each mixer to process a significantly narrower frequency range than would be possible with fewer mixers. Reducing mixer frequency range in this way results in reduced conversion loss, and therefore reduced system noise figure. By comparison, a prior-art two-mixer design, simply scaled in frequency, would require much greater frequency range from one or both of its $1^{st}$ mixers, resulting in higher conversion loss, and therefore higher system noise figure.

IV. Spectrum Analyzer Output with Selectable $2^{nd}$ IF Bands

The $2^{nd}$ IF output from either the "baseband" or "highbands" $2^{nd}$ mixer 42 is directed to a $2^{nd}$ IF amplifier 70, the output of which is then filtered by a bank of 3 selectable SAW bandpass filters 72. The filters can be connected using SP3T switches in the configuration shown in FIG. 8. The SAW filters 72 suppress the 1:1 image and higher order products of a $3^{rd}$ mixer (not shown) that can be used for downconversion of the $2^{nd}$ IF signal to a signal frequency acceptable for analysis by a digital signal processor. The SAW filters 72 can also serve to limit input bandwidth to the $3^{rd}$ IF mixer. In the case where there is not a $3^{rd}$ frequency conversion prior to signal digitization, the selectable SAW $2^{nd}$ IF filters 72 serve to suppress unwanted image products in the digitizer and to limit the bandwidth of signals incident to the digitizer. The multiple filters 72 allow more than two selectable $2^{nd}$ IF bandwidths. The multiple filter selections allow $2^{nd}$ IF bandwidth to be optimized for any of several digital modulation formats, including UMTS, DVB-T, and WIMAX. Bandwidth can be selected to admit one signal channel of interest while blocking much of the power from other signal channels that are spectrally close-by. By blocking much of the unwanted spectrum, the selected filter reduces inter-modulation distortion produced in the $3^{rd}$ mixer, $3^{rd}$ IF amplifiers, and $3^{rd}$ IF digitizer. This improves system ACLR (adjacent channel leakage ratio) when measuring a signal in a spectrum of closely spaced signals. The performance advantage realized by incorporation of 3 or more selectable $2^{nd}$ IF bandwidths also applies to variants of embodiments of invention in which the $2^{nd}$ IF signal is digitized without an intermediate $3^{rd}$ mixer stage.

Although the present invention has been described above with particularity, this was merely to teach one of ordinary skill in the art how to make and use the invention. Many additional modifications will fall within the scope of the invention, as that scope is defined by the following claims.

What is claimed:

1. A hand-held spectrum analyzer comprising:
   an input port for receiving an input signal to the spectrum analyzer; and
   an input switch connecting a common input port to a highband output port and to a baseband output port, the input switch comprising:
      a highpass filter connecting from the common input port to a highband output port, the highpass filter comprising first series and shunt elements;
      a lowpass filter connecting from the common input port to a baseband output port, the lowpass filter comprising first series and shunt elements;
      a first PIN diode switch embedded within the highpass filter such that the first PIN diode switch can short the highpass path to ground, and in doing so cause the first series element of the highpass filter to serve as a second shunt element for the lowpass filter;
      a second PIN diode switch embedded within the lowpass filter such that the second PIN diode switch can short the lowpass path to ground, and in doing cause the first series element of the lowpass filter to serve as a second shunt element for the highpass filter;
      a highband/midband switch for selectively connecting the highband output port of the input switch to a highband path port and a midband path port;
      baseband PIN diode switches selectively connecting one of a plurality of filters between the midband path port and a first mixer; and
      highband switches selectively connecting one of a plurality of filters between the highband path port and a second mixer.

2. The hand-held spectrum analyzer of claim 1, wherein the highband switches comprise Gallium Arsenide microwave integrated circuits.

3. The hand-held spectrum analyzer of claim 1,
   wherein the first series element of the highpass filter is a capacitor and the first shunt element of the highpass filter is an inductor, and wherein the first PIN diode switch connects the junction of the first series and shunt elements of the highpass filter to ground; and
   wherein the first series element of the lowpass filter is an inductor and the first shunt element of the lowpass filter is a capacitor, and wherein the second PIN diode switch connects the junction of the first series and shunt elements of the lowpass filter to ground.

\* \* \* \* \*